(12) United States Patent
Kim et al.

(10) Patent No.: US 8,445,998 B1
(45) Date of Patent: May 21, 2013

(54) LEADFRAME STRUCTURES FOR SEMICONDUCTOR PACKAGES

(75) Inventors: Young-Gon Kim, Cupertino, CA (US); Nikhil Vishwanath Kelkar, San Jose, CA (US); Louis Elliott Pflughaupt, Los Gatos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/712,170

(22) Filed: Feb. 24, 2010

Related U.S. Application Data

(62) Division of application No. 11/453,216, filed on Jun. 15, 2006, now Pat. No. 7,714,415.

(60) Provisional application No. 60/795,585, filed on Apr. 28, 2006.

(51) Int. Cl.
*H01L 23/495* (2006.01)

(52) U.S. Cl.
USPC ............ 257/676; 257/669; 257/673; 257/674

(58) Field of Classification Search
USPC .................. 257/669, 674, 673, 676
See application file for complete search history.

(56) References Cited

U.S. PATENT DOCUMENTS

| | | | | |
|---|---|---|---|---|
| 5,550,402 A | * | 8/1996 | Nicklaus | ........................ 257/669 |
| 7,265,445 B2 | * | 9/2007 | Wu et al. | ........................ 257/720 |

\* cited by examiner

*Primary Examiner* — Howard Weiss
*Assistant Examiner* — Tifney Skyles
(74) *Attorney, Agent, or Firm* — Wallace G. Walter

(57) ABSTRACT

A semiconductor package includes a lead structure upon which a semiconductor die is mounted with at least some portion of at least some of the leads extending to, at, or across an axis or axis of the package to militate against thermally induced growth of the package and the reduce or minimize strain within the package and reliability issue associated therewith.

6 Claims, 6 Drawing Sheets

LEADFRAME STRUCTURES FOR SEMICONDUCTOR PACKAGES

CROSS-REFERENCE TO RELATED APPLICATION

This application is a divisional application of U.S. patent application Ser. No. 11/453,216 filed Jun. 16, 2006 (now U.S. Pat. No. 7,714,415 issued May 11, 2010), which claims the benefit of U.S. Provisional Patent Application 60/795,585 filed Apr. 28, 2006 by the inventors herein and in common assignment herewith.

BACKGROUND OF THE INVENTION

The present invention relates to semiconductor devices and, more particularly, to the mitigation of thermally induced stress where the materials from which the semiconductor device is fabricated have differing coefficients of thermal expansion.

Numerous techniques have been developed to fabricate semiconductor packages: in general, a semiconductor die is placed upon a leadframe at a selected location with bonding wires connected between bonding pads on the die and respective ones of the connection leads on the leadframe. Thereafter, the leadframe/die assembly is subject to an encapsulating or molding step by which the leadframe/die assembly is encapsulated with a suitable molding compound to form the chip package. In general, the most common molding compounds are plastic or epoxy-like materials developed to have a thermal coefficient of expansion (CTE) that is sufficiently close to that of the die so that expansion and contraction of the encapsulated structure consequent to varying temperatures does not induce stresses sufficient to cause reliability issues, including, for example, soldered-connection failures, ball-bond or nail-bond connection failures, delamination, lifting, and/or micro-cracking on or within the body of the semiconductor package.

In general, molding compounds have been developed having coefficients of thermal expansion of appropriate value to reduce stress-induced issues to acceptable levels for most applications. However, molding compounds that are optically transmissive (for use in photo responsive devices) often have CTEs that are larger than usual, in part, because the optical transmissivity characteristic often necessitates larger than usual CTEs. For example, a clear molding compound sold under the NT-332H designation by Nitto Denko Corp. of Osaka, Japan has a CTE 8-40 times that of a conventional molding compound, such SumiKon EME-G700W sold by Sumitomo Bakelite Co. of Tokyo, Japan. As a consequence, chip structures utilizing these types of clear molding compounds are subject to thermal stress issues and have a somewhat higher than usual vulnerability to stress/strain induced problems.

SUMMARY OF THE INVENTION

Leadframe structures for semiconductor dies and packages suitable for use with molding compounds having higher than usual coefficients of expansion are provided with connection leads or pads that effectively reinforce the resulting chip structure by having at least some of the connection leads or pads extend across one or both of the longitudinal and lateral axes of the semiconductor package to structurally "stiffen" the resulting package. In the chip-on-lead (COL) configuration, at least some of the connection pads or leads extend away from the periphery of the package toward one or both of the longitudinal and lateral axes of the package with at least some of the extended connection pads or leads intercepting or crossing the longitudinal and/or lateral axes of the package. As a consequence, those extended portions of the connection pads or leads function to constrain expansion of the molding compound in those medial areas of the package most vulnerable to stress-induced warpage.

In the context of a split-die paddle configuration in which one or both sub-paddles are used as connection pads or leads, the paddle is divided or split in such as way that portions of sub-paddles extend to, cross-over, or extend beyond the axis separating the sub-paddles.

DESCRIPTION OF THE PREFERRED EMBODIMENT

Figure 1:
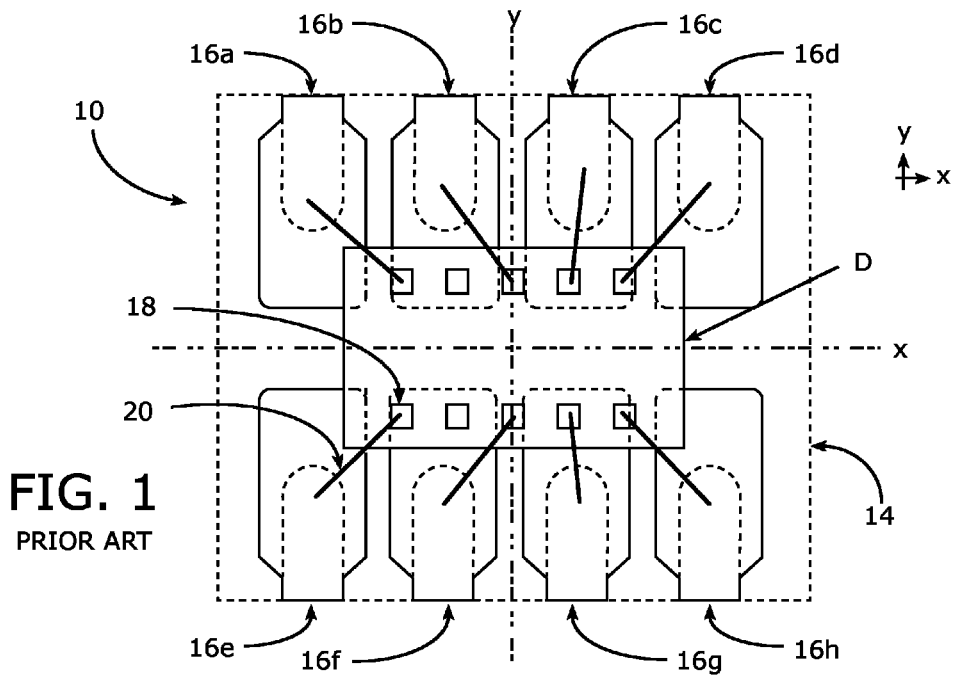
FIG. 1 is a pictorial plan view of a "chip-on-lead" (COL) semiconductor package showing an exemplary die overlying its connection pins with bonding wires connecting contact pads on the die and respective leadframe connection pads or leads.

FIG. 1 is a pictorial representation of a typical chip-on-lead (COL) semiconductor package 10 in which the package outline is shown in dotted-line by rectangle 14 with eight leadframe pads or leads 16a-16h arranged into two leadframe lead-groups with one such lead-group arranged above the x-axis and the other such leadframe lead-group arranged below the x-axis. The leadframe pads lie in a common plane to define a surface for supporting a semiconductor die or chip.

A semiconductor chip or die D is mount on or atop the plane defined by the various leadframe leads and can be attached thereto by an appropriate non-electrically conducting die-attach adhesive or cement. The die D is formed from a molded epoxy or similar material and includes an upper surface having conductive bonding pads 18 thereon that connect to circuitry on or within the die D. The lower surface of the die D defines a mounting surface for the die D. The bonding pads are typically connected to a respective leadframe pad or lead 16 by a bonding wire 20. In general, the ends of the bonding wires 20 are attached to their conductive pads or surfaces by ball-bond or nail-bond techniques and the package formed by overmolding with an encapsulant.

The above-described package is typically mounted on a printed circuit board, with or without an adhesive connection, and the underside of the leadframe leads 16 soldered to conductive pads on printed circuit board.

In FIG. 1, the particular leadframe leads shown are of the "no-lead" type (i.e., there are no leads extending beyond the periphery of the package) and are of the "half-etch" type; the leadframe pins shown are exemplary only and many other types of pins can be used. The eight-pin arrangement of FIG. 1 is illustrative only and, in practice, a semiconductor package can have many dozens of leadframe contacts.

In those cases were the die D has optical devices formed in or on the die D and a clear (i.e., optically transmissive) overmolding compound is used as some or all of the encapsulant, the coefficient of thermal expansion of the encapsulant can be 8-40 times higher than the conventional "black" molding compounds. When semiconductor packages having these higher CTEs are subject to higher temperature environments, the relatively high CTE causes the package to "grow" about the x- and y-axis. This thermally induced growth can stress the solder joints between the leadframe contacts and the conductive pads on the printed circuit board and may affect the connection between the ends of the bonding wires 20 and their respective bonding pads 18 on the die D or the leadframe pad or lead. While the thermally induced stress can be a simple shear stress, the manner in which the package is fabricated and the use of components or materials with different CTEs can cause differential stresses that, in turn, cause bending stresses that can add a tensile stress and/or a torsional stress to the shear stress. As can be appreciated, repeated thermal cycling can, with time, cause the initiation and the growth of stress cracks at soldered connections, interfacial delamination, and internal faults within the package. More specifically and as shown in FIG. 1, there are several direct paths (i.e., cleave lines) directly across the thin crystalline silicon chip, where the chip is the only structural member with no reinforcement from any underlying portion of the leadframe. For example, each of the x and y axes represent potential cleave lines; potential cleave lines also exist between the leads 16a-16b, 16c-16d, 16e-16f, and 16g-16h. Any thermal distortions in the package will be aggravated across these cleave lines and may cause the silicon to crack at these weaker sections.

FIGS. 2-5 illustrate representative leadframe configurations that address the stress issues discussed above with regard to FIG. 1; in each of these figures the die D is shown in dotted-line illustration without its bonding wires.

Figure 2:
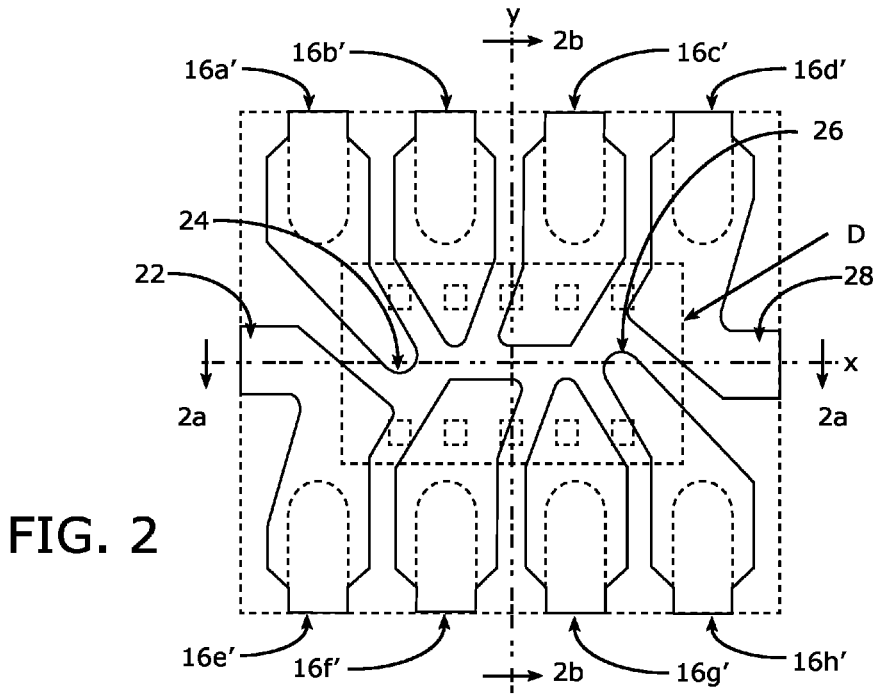
FIG. 2 is an example of a semiconductor package in accordance with the present invention with connection pads or leads of various configurations with some portion of some of the connection pads or leads extending across the x-axis and the y-axis.
Figure 2A:
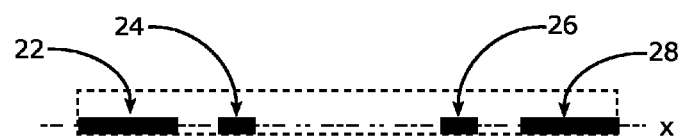
FIG. 2a is a cross-sectional view of FIG. 2 taken along line 2a-2a of FIG. 2.
Figure 2B:
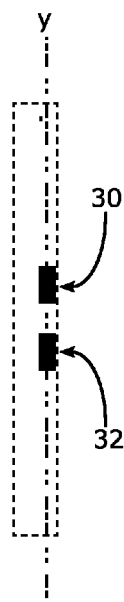
FIG. 2b is a cross-sectional view of FIG. 2 taken along line 2b-2b of FIG. 2.

FIG. 2 show the leadframe leads 16a'-16h' having different shapes compared to those of FIG. 1 with at least some of the leadframe leads crossing the longitudinally aligned x-axis (i.e., 16a', 16h', 16d', and 16e') and other of the leadframe leads crossing the laterally aligned y-axis (i.e., 16c' and 16f'). As is apparent, the pseudo-random lead-frame edges shown do not align across the silicon chip, so that simple cleave lines are not possible or at least minimized, thus strengthening the overall chip/lead-frame structure. The cross-sectional view of FIG. 2a taken along line 2a-2a of FIG. 2 shows the extent of the metal portions (at 22, 24, 26, and 28) of the leadframe leads crossing the x-axis while the cross-sectional view of FIG. 2b taken along line 2b-2b of FIG. 2 shows the extent of the metal portions (at 30, and 32) of the leadframe pins crossing the y-axis.

Figure 2C:
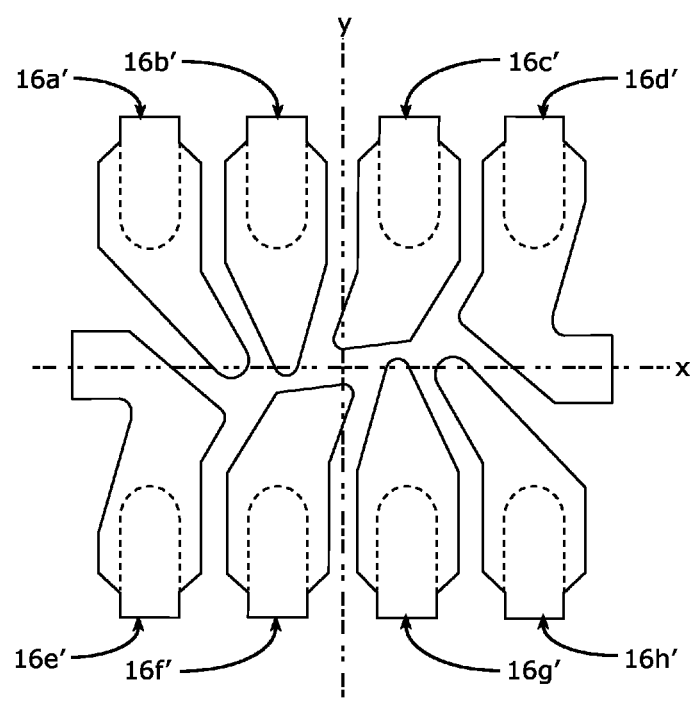
FIG. 2c is a variant of FIG. 2 showing only the leadframe arrangement or organization thereof.

FIG. 2c is a variant of FIG. 2 showing only the leadframe arrangement or organization thereof in which those portions of the leadframe pins 16b' and 16g' facing the x-axis have been elongated to cross-over the x-axis and provide additional support with the leadframe pins 16c' and 16f' being re-shaped to accommodate the elongated leadframe pins 16b' and 16g'.

The leadframe configuration of FIG. 2 places a metallic "reinforcement" across the x- and y-axes to reduce, restrain, or constrain thermal growth during temperature cycling; as a consequence, a substantial portion of any induced stress is accommodated by the lead structures shown. In general, the configurations shown in FIG. 2 and FIG. 2c for the various leadframes pins is exemplary and other configurations are suitable as long as metal extends to, is present at, or crosses-over the principal axes. Additionally, any leadframe lead configuration should, where possible, have gently curved edges and rounded or radiused inside and exterior corners to reduce or eliminate any stress concentrations.

Figure 3:
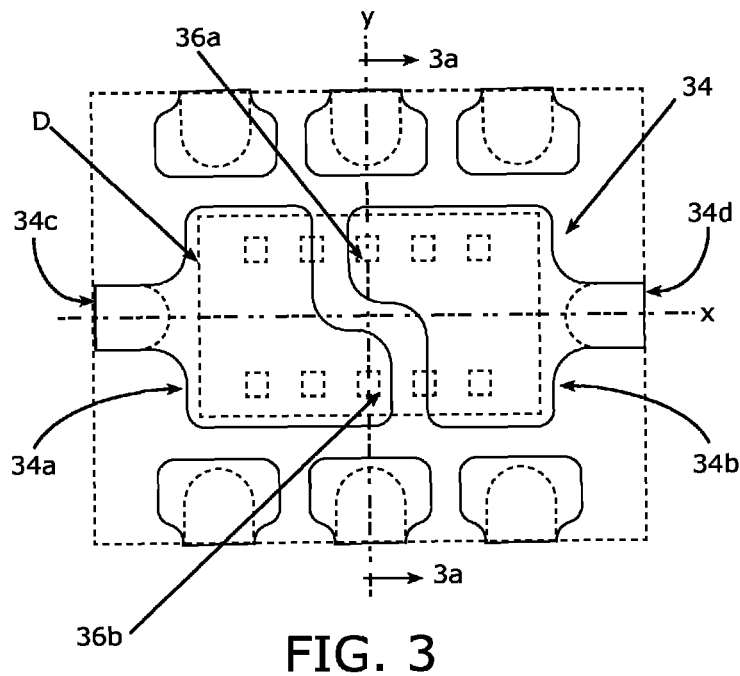
FIG. 3 is an example of a semiconductor package having a split die-paddle.
Figure 3A:
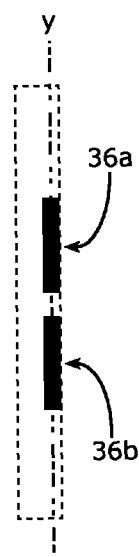
FIG. 3a is a cross-sectional view of FIG. 3 taken along line 3a-3a of FIG. 3.

FIG. 3 illustrates the application of the above-described concept to a chip structure that incorporates a split die paddle where each portion of the die paddle can also function as lead for connection to a contact on a die D (shown in dotted-line illustration and without its bonding wires). As shown in FIG. 3, a die paddle 36 is split into two sub-paddles, 34a and 34b, about the y-axis with portions of each sub-paddle, 36a and 36b, extending to and crossing over the y-axis; electrical contact with the sub-paddle 34a is available at contact 34c and with sub-paddle 34b at contact 34d. The cross-sectional view of FIG. 3a (taken along line 3a-3a of FIG. 3) shows the extent of the metal portions (at 36a and 36b) of the leadframe leads crossing the y-axis. As shown, those portions of the sub-paddles facing each other at the y-axis have rounded or radius corners to reduce or eliminate any stress concentrations and can be viewed as having respective "L" configurations.

As in the case of the leadframe configuration of FIG. 2, the configuration of FIG. 3 places a metallic "reinforcement" across the y-axes to constrain thermal growth during temperature cycling to limit warpage in both the x- and the y-directions; as a consequence, a substantial portion of any thermally induced stress is accommodated by the leadframe configurations shown. It can also be seen that the dog-leg lead-frame separation of FIG. 3 accomplishes the same effect of eliminating simple cleave lines in the silicon chip.

Figure 4:
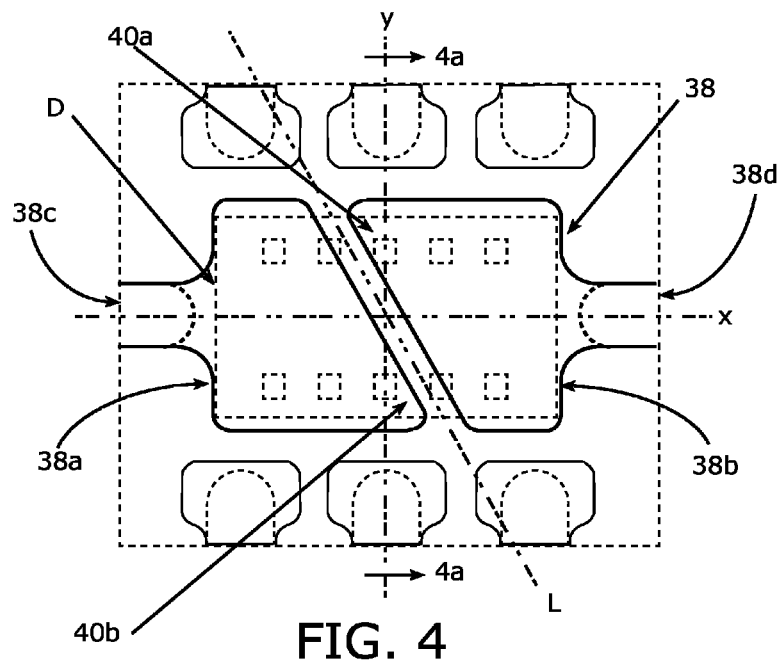
FIG. 4 is another example of a semiconductor package having a split die-paddle.
Figure 4A:
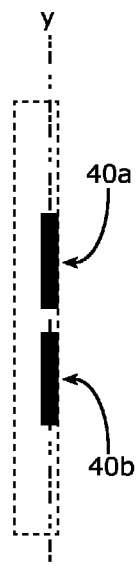
FIG. 4a is a cross-sectional view of FIG. 4 taken along line 4a-4a of FIG. 4.

FIG. 4 illustrates a variant of the split die paddle of FIG. 3 in which the die paddle is split along a diagonal or oblique line L (e.g., at an angle of about 30° relative to the y-axis) where each portion of the die paddle can also function as lead for connection to a contact on a die. As shown in FIG. 4, a die paddle 38 is split into two sub-paddles, 38a and 38b, about the y-axis with portions of each sub-paddle, 38a and 38b, extending to and crossing over the y-axis; electrical contact with the sub-paddle 38a is available at contact 38c and with sub-paddle 38b at contact 38d. The cross-sectional view of FIG. 4a (taken along line 4a-4a of FIG. 4) shows the extent of the metal portions (at 40a and 40b) of the leadframe pins crossing the y-axis. As shown, those portions of the sub-paddles facing each other at the y-axis have rounded or radius corners to reduce or eliminate any stress concentrations.

The split die-paddle configuration described above allow for each sub-paddle to also function as a contact lead; in the case of the embodiments of FIGS. 3 and 4, these sub-paddle contact leads are shows at the left and right ends of the structure.

Figure 5:
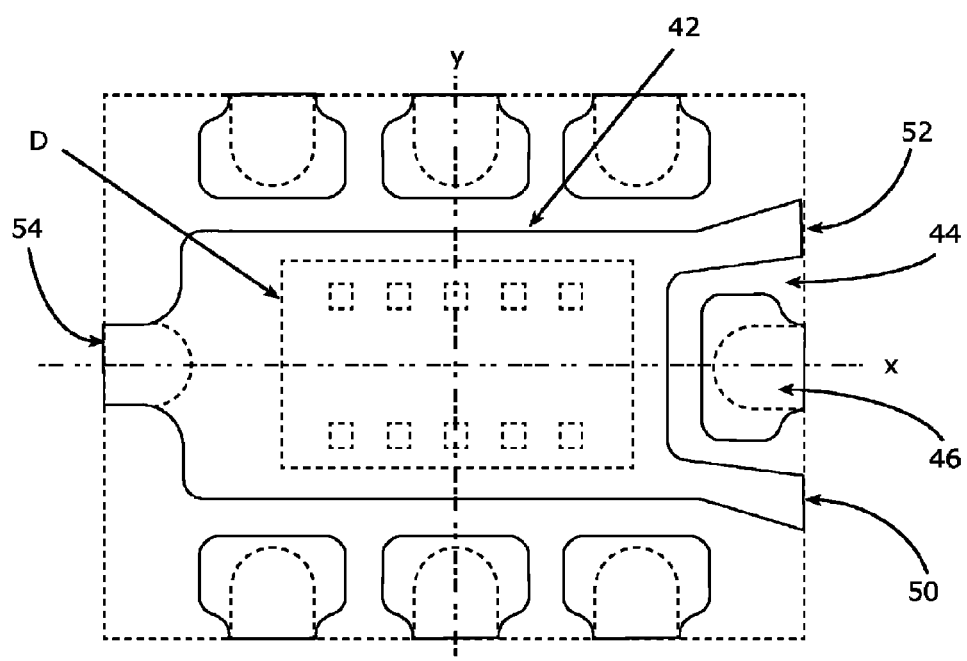
FIG. 5 is another variant of a semiconductor package not having a split die-paddle.

FIG. 5 provides for the same termination capabilities as in the previous figures (e.g., 8 pins); however, avoids the split die paddle, giving the silicon chip solid reinforcement throughout the package with no unsupported cleave lines. As shown, a die paddle 42 sub-tends a substantial area between the contact pins but is widened at its right end and also includes a "cut-out" 44 in which the contact lead 46 is placed. The cut-out 44 functions to define two rightwardly extending "legs" 50 and 52. The die paddle 42 provides substantial metal across the x- and y-axis while, at the same time, accommodating a contact lead 46 on the right side thereof; electrical contact with the die paddle 42 can be made via the contact 54 on the left side thereof or the ends of the rightwardly extending "legs" 50 and 52. One advantage of the arrangement of FIG. 5 is that there is no need for a non-conductive die attach material as typically used in conventional chip-on-lead (COL) structures since pin 46 is isolated from the die paddle 42. If conductive die attach material is used, then pin 54, which is common to die paddle 42 must be chosen at the same DC potential as the back of die substrate, usually the negative power voltage.

The "split-die-pad" variants of FIGS. 3-5 assist in minimizing X and Y package dimensions and thus reduce overall stresses in the high CTE optical packages while also maintaining a requisite 8-pin connections at a reasonable 0.65 mm pad pitch in a conventional MFN/QFN package form-factor and process.

As will be apparent to those skilled in the art, various changes and modifications may be made to the illustrated embodiment of the present invention without departing from the spirit and scope of the invention as determined in the appended claims and their legal equivalent.

The invention claimed is:

1. A split-die paddle semiconductor package, comprising;
   an arrangement of conductive leadframe pins, at least some of said leadframe pins electrically isolated from other of said leadframe pins;
   an arrangement of two conductive die-paddle portions electrically isolated from each other and having portions thereof defining a support surface for a semiconductor die;
   a semiconductor die having at least four substantially linear sides, each side formed substantially orthogonal relative to an adjacent side, a first set of said sides defined by two substantially parallel spaced-apart sides and a second set of said sides defined by two other substantially parallel spaced-apart sides, a first axis defined at a position midway between said sides defining said first set and a second axis orthogonal to said first axis, defined at a position midway between said sides defining said second set, said semiconductor die having a plurality of conductive pads for effecting an electrical connection with circuitry on or within said semiconductor die, said semiconductor die having at least one mounting surface, said mounting surface of said semiconductor die mounted on or attached to said support surface defined by said die paddle portions;
   bonding wires connecting selected ones of said conductive pads to at least a corresponding selected one of said leadframe pins; and
   a molding compound surrounding said semiconductor die and at least said portions of said die paddle portions defining said support surface;
   at least some of said portions of said die paddle portions defining said support surface extending across both said first and second orthogonal axes to reduce or restrain thermally induced growth of the package consequent to thermal expansion of the molding compound relative to at least the semiconductor die, said die paddle portions spaced-apart from one another by a curvilinear path having a first path portion on first side of the first axis and a first side of the second axis, a second path portion on the other side of the first axis and the other side of the second axis, and a curved path portion connecting the first and second path portions, the intersection of the first and second axes within the curved path portion.

2. The semiconductor package of claim 1, wherein at least a portion of the molding compound is optically transmissive.

3. The semiconductor package of claim 1, wherein where said package is a MFN/QFN package.

4. The semiconductor package of claim 1, wherein the arrangement of conductive leadframe pins comprises an even number of leadframe pins divided into first group of leadframe pins on a first side of said package and a second group of leadframe pins on another side of said package.

5. The semiconductor package of claim 1, wherein the arrangement of conductive leadframe pins comprises an even number of leadframe pins divided into a first group of leadframe pins on a first side of said package and a second group of leadframe pins on another side of said package, said first and second groups of leadframe pins having a equal number of leadframe pins.

6. The semiconductor package of claim 1, wherein the arrangement of conductive leadframe pins comprises eight pins divided into first group of four pins on a first side of said package and a second group of four pins on another side of said package.

* * * * *